United States Patent
Kitada

(10) Patent No.: US 8,721,052 B2
(45) Date of Patent: May 13, 2014

(54) PIEZOELECTRIC ELEMENT, LIQUID EJECTING HEAD AND LIQUID EJECTING APPARATUS

(75) Inventor: Kazuya Kitada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/291,924

(22) Filed: Nov. 8, 2011

(65) Prior Publication Data
US 2012/0086757 A1    Apr. 12, 2012

(30) Foreign Application Priority Data

Nov. 10, 2010   (JP) ................................. 2010-251851

(51) Int. Cl.
*B41J 2/015*   (2006.01)
(52) U.S. Cl.
USPC ........................................................... 347/68
(58) Field of Classification Search
None
See application file for complete search history.

(56) References Cited

U.S. PATENT DOCUMENTS

| | | | |
|---|---|---|---|
| 7,901,800 B2 * | 3/2011 | Shibata et al. | 428/701 |
| 8,235,507 B2 * | 8/2012 | Uraki | 347/68 |
| 2005/0236654 A1 | 10/2005 | Kijima et al. | |
| 2009/0302715 A1 | 12/2009 | Shibata et al. | |

FOREIGN PATENT DOCUMENTS

| | | |
|---|---|---|
| JP | 2009-283950 | 12/2009 |
| JP | 2009-295786 | 12/2009 |

OTHER PUBLICATIONS

Yasuyoshi Saito et al., "Lead-free piezoceramics," Nature, Nov. 4, 2004, pp. 84-87, vol. 432, Nature Publishing Group.

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element comprises a piezoelectric member made of a complex oxide and an electrode which contains platinum. The complex oxide contains potassium sodium niobate and bismuth ferrate. The molar ratio of the bismuth ferrate to the sum of the potassium sodium niobate and the bismuth ferrate is in the range of 3% to 10%. And the molar ratio of the sum of potassium and sodium to niobium is in the range of 103% to 115%.

4 Claims, 3 Drawing Sheets

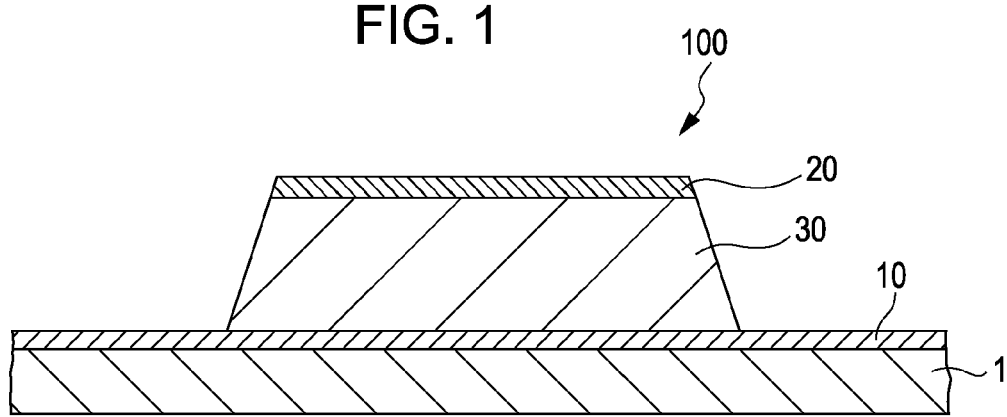
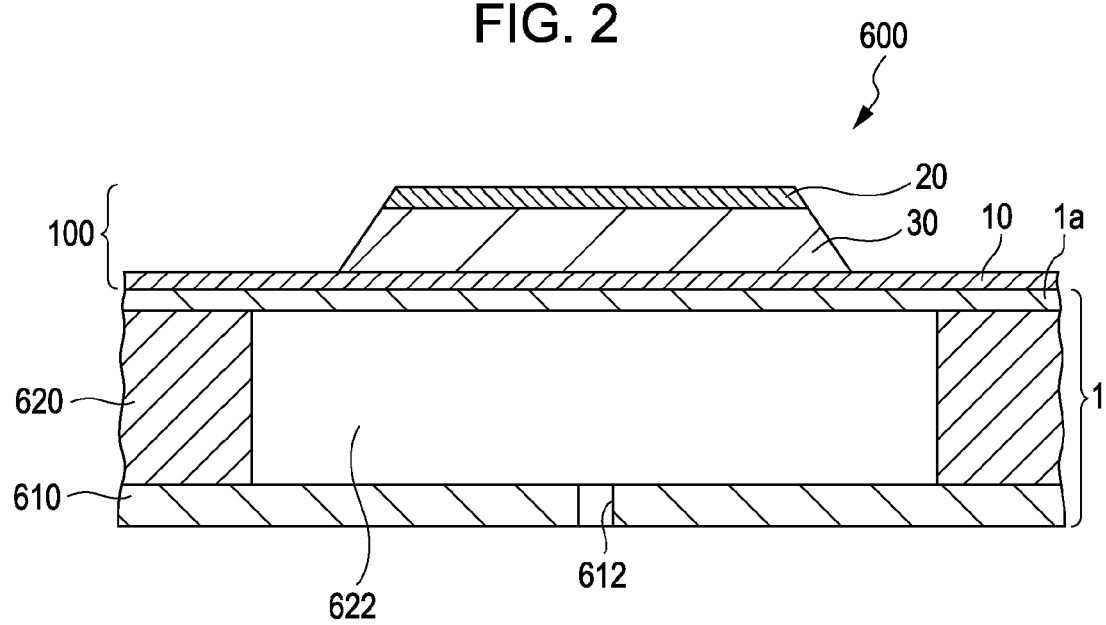

_US 8,721,052 B2_

PIEZOELECTRIC ELEMENT, LIQUID EJECTING HEAD AND LIQUID EJECTING APPARATUS

CROSS-REFERENCE TO RELATED APPLICATIONS

The entire disclosure of Japanese Patent Application No. 2010-251851, filed Nov. 10, 2010 is expressly incorporated by reference.

BACKGROUND

1. Technical Field

The present invention relates to a liquid ejecting head, a liquid ejecting apparatus and a piezoelectric element, and to a method for manufacturing a piezoelectric element.

2. Related Art

A liquid ejecting head is incorporated in a liquid ejecting apparatus, such as an ink jet printer. In this instance, the liquid ejecting head is used for ejecting ink droplets to fly them, so that the ink jet printer can deposit the ink on a medium such as paper and thus perform printing (see JP-A-2009-283950).

In general, a liquid ejecting head includes a piezoelectric element that applies a pressure to liquid to eject the liquid through a nozzle. Such a piezoelectric element may have a structure in which a piezoelectric member made of a piezoelectric material capable of electromechanical conversion, such as a crystallized piezoelectric ceramic, is disposed between two electrodes. This type of piezoelectric element can be deformed by the voltage applied by the two electrodes.

It is preferable that piezoelectric materials used for this application have high electromechanical conversion efficiency or other piezoelectric characteristics. Lead zirconate titanate (PZT) is superior in piezoelectric characteristics to other piezoelectric materials, and PZT materials have been studied and developed. However, in view of environmental issues, non-lead piezoelectric materials become desirable, including lead-free materials and lead-less materials whose lead content has been minimized.

For example, $(K,Na)NbO_3$ (KNN, potassium sodium niobate) is theoretically considered to be a lead-free piezoelectric material having high piezoelectric characteristics.

However, while KNN can form an alignment layer preferentially oriented in a predetermined direction on oxide electrodes such as those of strontium-ruthenium complex oxides ($SrRuO_x$, abbreviated as SRO) or strontium-titanium complex oxides ($SrTiO_x$, abbreviated as STO), it is difficult to form such an NKK alignment layer on a Pt (platinum) electrode, which is generally used for piezoelectric elements.

SUMMARY

Accordingly, an advantage of some aspects of the invention is that it provides a liquid ejecting head, a liquid ejecting apparatus and a piezoelectric element, in which a KNN thin film is preferentially oriented in the (100) direction, and a method for manufacturing a piezoelectric element in which a KNN thin film can be preferentially oriented in the (100) direction.

A liquid ejecting head according to an embodiment of the invention includes a pressure chamber communicating with a nozzle aperture and a piezoelectric element. The piezoelectric element includes a piezoelectric member and a first and a second electrode disposed to the piezoelectric member. At least one of the first and second electrodes contains platinum. The piezoelectric member is made of a complex oxide containing potassium sodium niobate and bismuth ferrate. In the complex oxide, the molar ratio of the bismuth ferrate to the sum of the potassium sodium niobate and the bismuth ferrate is in the range of 3% to 10%, and the molar ratio of the sum of potassium and sodium to niobium is in the range of 103% to 115%.

In the liquid ejecting head of this embodiment, a KNN thin film is preferentially oriented in the (100) direction and thus forms the piezoelectric member.

In another embodiment of the invention, a liquid ejecting apparatus including the liquid ejecting head is provided.

In this liquid ejecting apparatus, a KNN thin film is preferentially oriented in the (100) direction and thus forms the piezoelectric member.

A piezoelectric element according to still another embodiment of the invention includes a piezoelectric member made of a complex oxide containing potassium sodium niobate and bismuth ferrate, and a first and a second electrode disposed to the piezoelectric member. At least one of the first and second electrodes contains platinum. In the complex oxide, the molar ratio of the bismuth ferrate to the sum of the potassium sodium niobate and the bismuth ferrate is in the range of 3% to 10%, and the molar ratio of the sum of potassium and sodium to niobium is in the range of 103% to 115%.

In this piezoelectric element, a KNN thin film is preferentially oriented in the (100) direction and thus forms the piezoelectric member.

According to still another embodiment of the invention, a method for manufacturing a piezoelectric element is provided. In this method, a first electrode containing platinum is formed, and a piezoelectric member containing potassium sodium niobate and bismuth ferrate is formed by applying a precursor solution on the first electrode, and crystallizing the precursor solution on the first electrode. Also, a second electrode is formed on the piezoelectric member. The precursor solution contains an organic metal compound containing niobium, potassium, sodium, iron and bismuth. In the piezoelectric member, the molar ratio of the bismuth ferrate to the sum of the potassium sodium niobate and the bismuth ferrate is in the range of 3% to 10%, and the molar ratio of the sum of potassium and sodium to niobium is in the range of 103% to 115%.

This embodiment can produce a piezoelectric element including a piezoelectric member formed by preferentially orienting a KNN thin film in the (100) direction.

BRIEF DESCRIPTION OF THE DRAWINGS

The invention will be described with reference to the accompanying drawings, wherein like numbers reference like elements.

FIG. 1 is a sectional view of a piezoelectric element according to an embodiment of the invention.

FIG. 2 is a schematic sectional view of a liquid ejecting head according to an embodiment of the invention.

DESCRIPTION OF EXEMPLARY EMBODIMENTS

Figure 3:
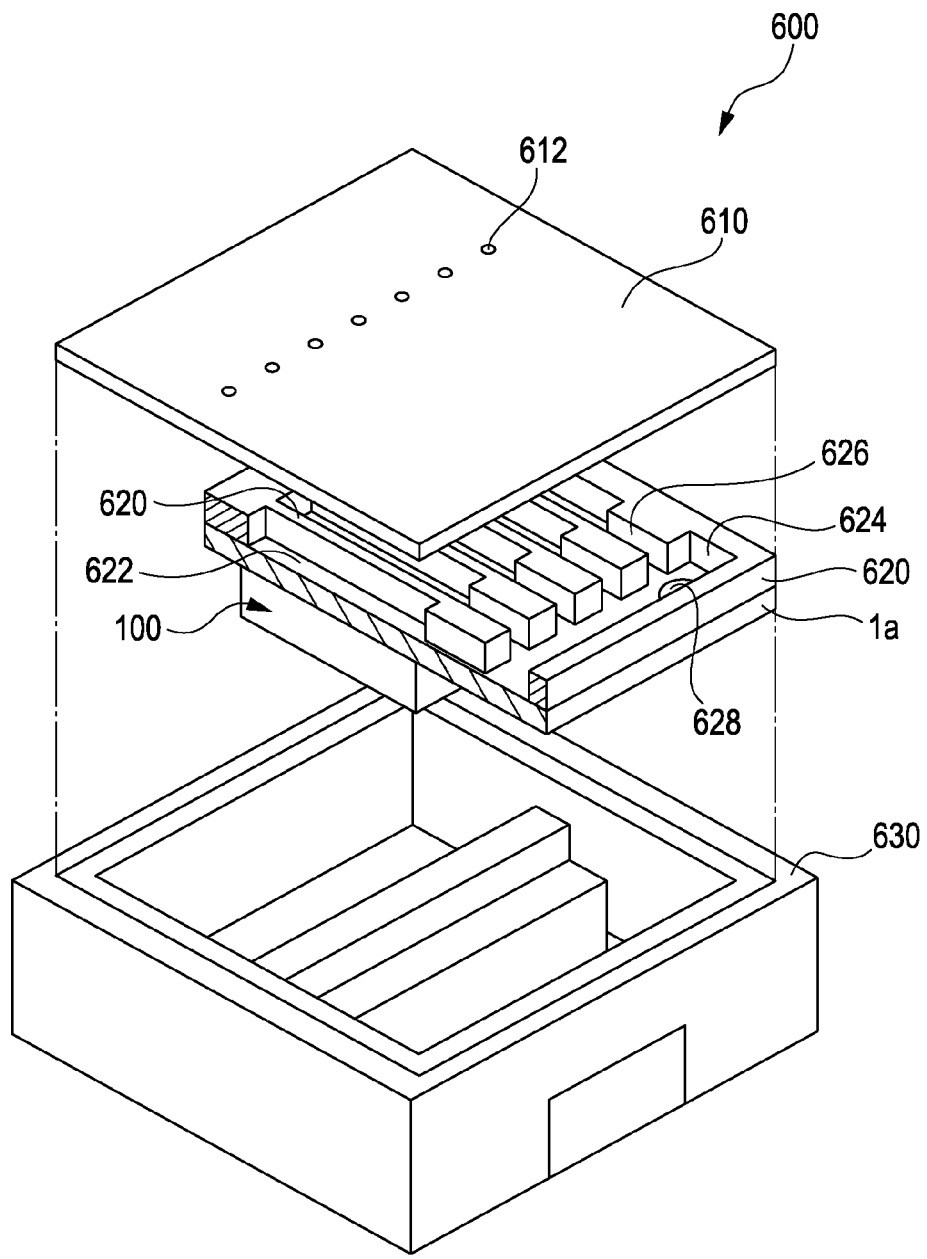
FIG. 3 is an exploded perspective view of the liquid ejecting head according to the embodiment.

Exemplary embodiments of the invention will now be described with reference to the drawings. The embodiments described below are not intended to limit the invention specified in the appended claims. All the components disclosed in the following embodiments are not required for the invention.

1. Piezoelectric Element

FIG. 1 is a sectional view of a piezoelectric element 100 according to an embodiment of the invention.

The piezoelectric element 100 includes a piezoelectric member 30, and a first electrode 10 and a second electrode 20 that are disposed to the piezoelectric member 30. At least either the first electrode 10 or the second electrode 20 contains platinum, and the piezoelectric member 30 contains potassium sodium niobate and bismuth ferrate. In the piezoelectric member, the sum of the mole numbers of potassium and sodium is larger than the mole number of niobium.

1. 1. First Electrode

The first electrode 10 is disposed on a substrate 1. The substrate 1 may be a flat plate made of an electrically conductive material, a semiconductor material, or an insulating material. The substrate 1 may be composed of a single layer or a plurality of layers. The substrate 1 may have any internal structure and may be a hollow plate, as long as the upper surface is flat. If a pressure chamber or the like is disposed under the substrate 1, like a liquid ejecting head that will be described later, the substrate 1 and the structure under the substrate 1 may be considered to be a substrate as a whole.

The substrate 1 may be a flexible elastic member (vibration plate) that can be deformed (bent) by the behavior of the piezoelectric member 30. That the substrate 1 is flexible means that the substrate 1 can bend. When an elastic member (vibration plate) is used as the substrate 1 and the piezoelectric element 100 is used in a liquid ejecting head, it is good enough that the substrate 1 can be bent so as to reduce the capacity of the pressure chamber by the same volume as the volume of the liquid to be ejected.

A substrate 1 acting as an elastic member (vibration plate) can be made of an inorganic compound such as zirconium oxide, silicon nitride or silicon oxide, or an alloy such as stainless steel. Among these materials, zirconium oxide is particularly suitable for the elastic member in view of chemical stability and stiffness. In this instance as well, the substrate 1 may be composed of at least two layers made of those materials.

The first electrode 10 is preferably a thin film. This is because the piezoelectric member 30 is a thin film, but the shape of the first electrode 10 is not particularly limited as long as it opposes the second electrode 20. The first electrode 10 has a thickness, for example, in the range of 50 to 300 nm. Also, the shape in plan view of the first electrode 10 is not particularly limited as long as the piezoelectric member 30 can be disposed between the first electrode 10 and the opposing second electrode 20. In the present embodiment, the first electrode 10 has a rectangular or circular shape when viewed from above.

One of the functions of the first electrode 10 is to form a pair with the second electrode 20 so as to act as one of the electrodes (for example, a lower electrode disposed under the piezoelectric member 30) for applying a voltage to the piezoelectric member 30. The first electrode 10 may have the function of controlling the crystal orientation of the piezoelectric member 30 when it is crystallized.

The first electrode 10 may contain platinum. For example, the first electrode 10 may be made of a material containing platinum or elemental platinum.

1. 2. Second Electrode

The second electrode 20 opposes the first electrode 10. The entirety or part of the second electrode 20 may oppose the first electrode 10. The second electrode 20 is preferably a thin film. This is because the piezoelectric member 30 is a thin film, but the shape of the second electrode 20 is not particularly limited as long as it opposes the first electrode 10. The second electrode 20 has a thickness, for example, in the range of 50 to 300 nm. Also, the shape in plan view of the second electrode 20 is not particularly limited as long as the piezoelectric member 30 can be disposed between the first electrode 10 and the opposing second electrode 20. In the present embodiment, the second electrode 20 has a rectangular or circular shape when viewed from above.

One of the functions of the second electrode 20 is to act as one of the electrodes that apply a voltage to the piezoelectric member 30 (for example, an upper electrode disposed on the piezoelectric member 30). The second electrode 20 may have the function of controlling the crystal orientation of the piezoelectric member 30 when it is crystallized.

The second electrode 20 may be made of a metal such as nickel, iridium or platinum, a conductive oxide of these metals, such as iridium oxide, a complex oxide of strontium and ruthenium ($SrRuO_x$, abbreviated as SRO), or a complex oxide of lanthanum and nickel ($LaNiO_x$, abbreviated as LNO). The second electrode 20 may be composed of a single layer or a plurality of layers made of different materials.

Although, in FIG. 1, the first electrode 10 has a larger area than the second electrode 20, the second electrode 20 may have a larger area than the first electrode 10. In this instance, the second electrode 20 may be disposed not only on the upper surface of the piezoelectric member 30, but also on the side surfaces of the piezoelectric member 30. The second electrode 20 extending so as to cover the side surfaces of the piezoelectric member 30 can function to protect the piezoelectric member from moisture, hydrogen or the like, in addition to the function as an electrode.

1. 3. Piezoelectric Member

The piezoelectric member 30 is disposed between the first electrode 10 and the second electrode 20. The piezoelectric member 30 is in contact with at least either the first electrode 10 or the second electrode 20. In the embodiment shown in FIG. 1, the piezoelectric member 30 is in contact with both the first electrode 10 and the second electrode 20. In other words, the piezoelectric member 30 is provided with the first electrode 10 and the second electrode 20.

The piezoelectric member 30 may be formed as a thin film by a liquid phase method. The liquid phase method may be performed by, for example, metal-organic decomposition (hereinafter referred to as MOD method) or a sol-gel method.

The thickness of the piezoelectric member 30 may be, but is not limited to, 100 to 3000 nm. If a thick piezoelectric member 30 is formed by a liquid phase method, the piezoelectric member 30 may be constituted of a plurality of thin layers formed by repeating a sequence of operations of forming a coating by, for example, a MOD method or sol-gel method and firing the coating. If a multilayer piezoelectric member is formed, the layers of the multilayer structure may be formed by different liquid-phase methods.

The piezoelectric member 30 of the present embodiment is made of a complex oxide containing potassium sodium niobate and bismuth ferrate. In the piezoelectric member 30, the molar ratio of the bismuth ferrate to the sum of the potassium sodium niobate and the bismuth ferrate is in the range of 3% to 10%, and the molar ratio of the sum of potassium and sodium to niobium is in the range of 103% to 115%.

In the piezoelectric element 100 of the present embodiment, a KNN thin film can be preferentially oriented in the (100) direction, and thus forms the piezoelectric member 30.

In the piezoelectric member 30 of the present embodiment, the mole number of sodium may be larger than that of potassium, or the mole number of potassium may be larger than that of sodium.

The piezoelectric element 100 of the present embodiment can be used in a wide range of applications. For example, the piezoelectric element 100 can be suitably used in liquid ejecting apparatuses such as liquid ejecting heads and ink jet printers, various sensors such as gyro sensors and acceleration sensors, timing devices such as fork oscillators, and ultrasonic devices such as ultrasonic motors.

2. Method for Manufacturing the Piezoelectric Element

In a method for manufacturing the piezoelectric element 100, according to an embodiment of the invention, a first electrode 10 containing platinum is formed, and a piezoelectric member 30 containing potassium sodium niobate and bismuth ferrate is formed by applying a precursor solution on the first electrode 10, and crystallizing the precursor solution on the first electrode 10. Also, a second electrode 20 is formed on the piezoelectric member 30. The precursor solution contains an organic metal compound containing niobium, potassium, sodium, iron and bismuth, and in which the sum of the mole numbers of potassium and sodium is larger than the mole number of niobium. For example, the piezoelectric element 100 can be manufactured as below.

First, a substrate 1 is prepared, and a first electrode 10 containing platinum is formed on the substrate 1. The first electrode 10 may be formed by, for example, sputtering, plating, or vacuum vapor deposition. The first electrode 10 may be patterned if necessary.

Then, a precursor solution is applied onto the first electrode 10, and is crystallized to form a piezoelectric member 30. The piezoelectric member 30 can be formed as above by, for example, either MOD or a sol-gel method, or combination of these methods. The crystallization of the precursor solution of the piezoelectric member 30 is performed by heat treatment at a temperature in the range of 500 to 800° C. In the present embodiment, the crystallization may be performed in a nitrogen atmosphere, but the atmosphere is not limited to nitrogen. For example, the crystallization may be performed an atmosphere of oxygen or air. The crystallization may be performed after patterning the piezoelectric member 30. The above operations may be repeated as required for forming a piezoelectric member 30 having a desired thickness.

The precursor solution applied to the first electrode 10 contains an organic metal compound containing niobium, potassium, sodium, iron, and bismuth. More specifically, the precursor solution is prepared so that the resulting piezoelectric member 30 contains potassium sodium niobate and bismuth ferrate in such proportions that the molar ratio of bismuth ferrate to the sum of potassium sodium niobate and bismuth ferrate is in the range of 3% to 10%, and that the molar ratio of the sum of potassium and sodium to niobium is in the range of 103% to 115%. Thus, a KNN thin film can be preferentially oriented in the (100) direction, and thus forms the piezoelectric member 30.

In the precursor solution, the mole number of sodium may be larger than that of potassium, or the mole number of potassium may be larger than that of sodium.

Subsequently, a second electrode 20 is formed on the piezoelectric member 30. The second electrode 20 may be formed by, for example, sputtering, plating, or vacuum vapor deposition. The second electrode 20 and the piezoelectric member 30 are patterned into a desired shape to complete a piezoelectric element 100. Through the above operations, the piezoelectric element 100 of the present embodiment is produced.

3. Liquid Ejecting Head

A liquid ejecting head 600 will now be described as one of the applications of the piezoelectric element 100, with reference to drawings. FIG. 2 is a schematic sectional view of a liquid ejecting head 600 according to an embodiment. FIG. 3 is an exploded perspective view of the liquid ejecting head 600, showing a state where the head is reversed from the normal position. In the liquid ejecting head 600 described below, the piezoelectric element 100 is disposed on a substrate 1 (structure including a vibration plate 1a at the upper side the substrate 1).

The liquid ejecting head 600 includes pressure chambers 622 communicating with nozzle apertures 612 and a piezoelectric element 100. The piezoelectric element 100 includes a piezoelectric member 30, and a first electrode 10 and a second electrode 20 that are disposed to the piezoelectric member 30. At least one of the first and second electrodes 10 and 20 contains platinum. The piezoelectric member 30 is made of a complex oxide containing potassium sodium niobate and bismuth ferrate. In the complex oxide, the molar ratio of bismuth ferrate to the sum of potassium sodium niobate and bismuth ferrate is in the range of 3% to 10%, and the molar ratio of the sum of potassium and sodium to niobium is in the range of 103% to 115%. In the piezoelectric member 30 of the present embodiment, the mole number of sodium may be larger than that of potassium, or the mole number of potassium may be larger than that of sodium.

In the embodiment shown in FIGS. 2 and 3, the liquid ejecting head 600 includes a nozzle plate 610 having the nozzle apertures 612, a pressure chamber substrate 620 in which the pressure chambers 622 communicating with the nozzle apertures 612 are formed, and the piezoelectric element 100. In addition, the liquid ejecting head 600 includes an enclosure 630, as shown in FIG. 3. In FIG. 3, the piezoelectric element 100 is simplified.

Ink is ejected through the nozzle apertures 612. The nozzle apertures 612 may be aligned in a line in the nozzle plate 610. The nozzle plate 610 may be made of silicon or stainless steel (SUS).

The pressure chamber substrate 620 is disposed on the nozzle plate 610 (under the nozzle plate in FIG. 3). The pressure chamber substrate 620 may be made of, for example, silicon. The pressure chamber substrate 620 divides the space between the nozzle plate 610 and the vibration plate 1a so as to form a reservoir (liquid storage portion) 624, delivering paths 626 communicating with the reservoir 624, and pressure chambers 622 communicating with the respective delivering paths 626, as shown in FIG. 3. In the present embodiment, the reservoir 624, the delivering paths 626 and the pressure chambers 622 are described separately. However, they all function as liquid flow channels, and the flow channels can be arbitrarily designed without particular limitation. The delivering paths 626 shown in FIG. 3 are each partially narrowed, but can be formed in any shape according to the design without being limited to such a shape. The reservoir 624, the delivering paths 626 and the pressure chambers 622 are partitioned by the nozzle plate 610, the pressure chamber substrate 620 and the vibration plate 1a. The reservoir 624 can temporally store ink supplied from the outside (for example, an ink cartridge) through a through hole 628 formed in the vibration plate 1a. The ink in the reservoir 624 is delivered to the pressure chambers 622 through the delivering paths 626.

The capacity of the pressure chamber 622 is varied by the deformation of the vibration plate 1a. The pressure chambers 622 communicate with the corresponding nozzle apertures 612. By varying the capacity of the pressure chamber 622, the ink is ejected through the nozzle aperture 612.

The piezoelectric element 100 is disposed over the pressure chamber substrate 620 (under the pressure chamber substrate in FIG. 3). The piezoelectric element 100 is electrically connected to a piezoelectric element driving circuit (not shown) so as to be operated (for vibration or deformation) according to the signal from the piezoelectric element driving circuit. The vibration plate 1a is deformed by the behavior of the piezoelectric member 30 to vary the pressure in the pressure chamber 622 as required.

The enclosure 630 accommodates the nozzle plate 610, the pressure chamber substrate 620 and the piezoelectric element 100, as shown in FIG. 3. The enclosure 630 can be made of, for example, a resin or a metal.

The liquid ejecting head 600 includes the above-described piezoelectric element 100. Hence, in the liquid ejecting head 600 of the present embodiment, a KNN thin film is preferentially oriented in the (100) direction, and thus forms the piezoelectric member.

In the above description, an ink jet recording head has been illustrated as an embodiment of the liquid ejecting head 600. However, the liquid ejecting head may be used as a color material ejecting head used for manufacturing color filters of liquid crystal displays or the like, an electrode material ejecting head used for forming electrodes of organic EL displays or field emission displays (FEDs), or a bioorganic material ejecting head used for manufacturing bio-chips.

4. Liquid Ejecting Apparatus

Figure 4:
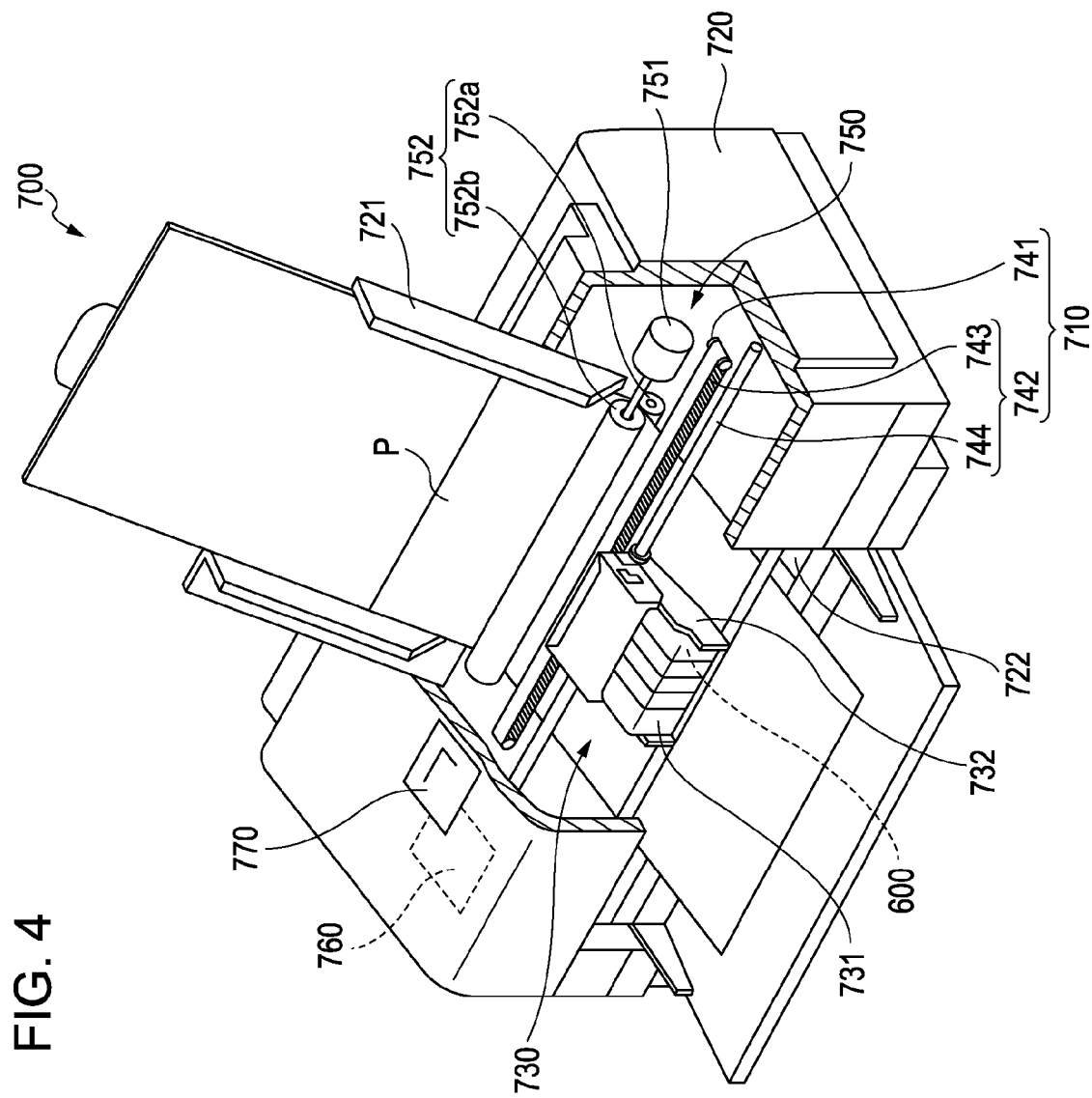
FIG. 4 is a schematic perspective view of a liquid ejecting apparatus according to an embodiment of the invention.

A liquid ejecting apparatus 700 according to an embodiment of the invention will now be described with reference to a drawing. FIG. 4 is a schematic perspective view of the liquid ejecting apparatus 700. The liquid ejecting apparatus 700 includes the above-described liquid ejecting head 600. In the following description, the liquid ejecting apparatus 700 functions as an ink jet printer including the liquid ejecting head 600.

The liquid ejecting apparatus 700 includes a head unit 730, a driving section 710, and a control section 760, as shown in FIG. 4. The liquid ejecting apparatus 700 further includes an apparatus body 720, a paper feeding section 750, a tray 721 on which recording paper P is placed, a paper ejecting port 722 from which the recording paper P is ejected, and a control panel 770 disposed on the upper surface of the apparatus body 720.

The head unit 730 includes an ink jet recording head (hereinafter may be simply referred to as the head) including the liquid ejecting head 600. The head unit 730 further includes an ink cartridge 731 from which an ink is delivered to the head, and a transport portion (carriage) 732 on which the head and the ink cartridge 731 are disposed.

The driving section 710 reciprocally moves the head unit 730. The driving section 710 includes a carriage motor 741 acting as a driving source of the head unit 730, and a reciprocal movement mechanism 742 allowing the head unit 730 to be reciprocally moved by the rotation of the carriage motor 741.

The reciprocal movement mechanism 742 includes a carriage guide shaft 744 whose ends are held by a frame (not shown), and a timing belt 743 extending in parallel with the carriage guide shaft 744. The carriage guide shaft 744 supports the carriage 732 so as to allow the reciprocal movement of the carriage 732. The carriage 732 is secured to part of the timing belt 743. When the timing belt 743 is moved by the operation of the carriage motor 741, the head unit 730 reciprocally moves along the carriage guide shaft 744. The head ejects ink during the reciprocal movement to print on the recording paper P.

In the liquid ejecting apparatus 700 of the present embodiment, printing is performed while both the liquid ejecting head 600 and the recording paper P are moving. However, only either the liquid ejecting head 600 or the recording paper P may move, as long as the liquid ejecting head 600 can perform recording on the recording paper P while the positions of the head 600 and the recording paper P are relatively changed. In the present embodiment, printing is performed on the recording paper P. However, the recording medium on which the liquid ejecting apparatus prints is not limited to paper, and it can be appropriately selected from a wide range of media including cloth, plastic sheets, and metal sheets.

The control section 760 can control the head unit 730, the driving section 710 and the paper feeding section 750.

The paper feeding section 750 feeds recording paper P toward the head unit 730 from the tray 721. The paper feeding section 750 includes a paper feeding motor 751 acting as a driving source, and paper feeding rollers 752 rotated by the operation of the paper feeding motor 751. The paper feeding rollers 752 include a driven roller 752a and a driving roller 752b vertically opposing each other between which the recording paper P is fed. The driving roller 752b is coupled with the paper feeding motor 751. When the paper feeding section 750 is driven by the control section 760, the recording paper P is transported under the head unit 730.

The head unit 730, the driving section 710, the control section 760 and the paper feeding section 750 are disposed within the apparatus body 720.

The liquid ejecting apparatus 700 includes the above-described piezoelectric element 100. Hence, in the liquid ejecting apparatus 700 of the present embodiment, a KNN thin film is preferentially oriented in the (100) direction, and thus forms a piezoelectric member.

Although the liquid ejecting apparatus 700 of the present embodiment includes a single liquid ejecting head 600 that can print on a recording medium, the liquid ejecting apparatus 700 may include a plurality of liquid ejecting heads 600. If a plurality of liquid ejecting heads are used, they may be independently operated as described above, or may be connected to each other to define a combined single head. Such a combined head may be, for example, a line head in which heads are arranged in such a manner that the nozzle apertures of the heads are aligned at regular intervals.

While the liquid ejecting apparatus 700 of the present embodiment acts as an ink jet printer, the liquid ejecting apparatus of another embodiment may be used in industrial fields. In this instance, the liquid ejected from the apparatus may be a functional material whose viscosity has been adjusted with a solvent or disperse medium. The liquid ejecting apparatus of the embodiments of the invention can be used as color material ejecting apparatuses used for manufacturing color filters of liquid crystal displays, liquid material ejecting apparatuses used for forming electrodes and color filters of organic EL displays, field emission displays (FEDs) and electrophoretic displays, and bioorganic material ejecting apparatuses used for manufacturing bio-chips, in addition to the above-described recording apparatus or printer.

5. Examples and Comparative Examples

The present invention will be further described in detail with reference to Examples and Comparative Examples. However, the invention is not limited to the following Examples.

5. 1. Preparation of Piezoelectric Element

Each piezoelectric element of Examples 1 to 9 and Comparative Examples 1 to 9 were prepared as below.

The substrate was formed by the following procedure. First, a silicon dioxide (SiO$_2$) film was formed to a thickness of 1170 nm on a silicon substrate by thermal oxidation. A titanium oxide (TiO$_2$) film was formed to a thickness of 20 nm on the SiO$_2$ film by DC sputtering and thermal oxidation, and a platinum (Pt) lower electrode layer (first electrode 10) was further formed to a thickness of 130 nm.

Each piezoelectric member 30 of the Examples and Comparative Examples was formed by MOD as below. A precursor solution of potassium sodium niobate and bismuth ferrate was applied onto the first electrode 10 by spin coating. The precursor solutions of the Examples and Comparative Examples had different compositions from each other. The spin coating was performed at a rotation speed of 1500 rpm.

The coating of the precursor solution was dried at 150° C. for 2 minutes in the air. Subsequently, the precursor coating was heat-treated at 350° C. for 4 minute in the air to remove organic components from the precursor coating (degreasing). In each of the Examples and Comparative Examples, a sequence of operations of coating, drying and degreasing of the precursor solution was repeatedly performed 4 times. Subsequently, the sample was fired at 700° C. for 5 minutes in a firing furnace (rapid thermal annealing (RTA) furnace) to which oxygen was introduced at a flow rate of 0.5 L/min.

In each of the Examples and Comparative Examples, another sequence of operations of coating, drying and degreasing of the precursor solution was performed twice. Thus, a 500 nm thick piezoelectric member 30 was prepared.

A 100 nm thick Pt film was formed as a second electrode 20 on the piezoelectric member 30 by DC sputtering. Then, the second electrode was fired to be secured at 700° C. for 5 minutes in a RTA furnace to which nitrogen was introduced at a flow rate of 0.5 L/min. Thus, piezoelectric elements of the Examples and Comparative Examples were completed.

The precursor solution of each of the Examples and Comparative Examples contains organic acid salts of niobium, potassium, sodium, iron and bismuth, and a solvent selected from among octane, xylene and n-butanol.

Each of the resulting piezoelectric members 30 contains a complex oxide containing potassium sodium niobate and bismuth ferrate (hereinafter may be represented as "KNN-BFO"), expressed by the following formula (I):

$$[(K_y,Na_z)NbO_3/+x[BiFeO_3]] \quad (I)$$

This KNN-BFO is an ABO$_3$ type complex oxide, that is, a so-called perovskite oxide, and can have a perovskite crystal structure by crystallization. KNN-BFO having a perovskite crystal structure can exhibit piezoelectric characteristics.

The composition of each precursor solution used for MOD in the Examples and Comparative Examples is represented in the Table by the concentrations of the respective elements in the material solution in terms of percentages (mol %) of the elements in the material. The complex oxide of each of the Examples and Comparative Examples is represented in the Table by coefficients x, y and z of formula (I).

TABLE

| | x | y | z | y + z | Degree of orientation |
|---|---|---|---|---|---|
| Example 1 | 0.03 | 0.50 | 0.51 | 1.01 | 0.918 |
| Example 2 | 0.03 | 0.50 | 0.53 | 1.03 | 0.962 |
| Example 3 | 0.03 | 0.50 | 0.65 | 1.15 | 0.973 |
| Example 4 | 0.03 | 0.50 | 0.70 | 1.20 | 0.918 |
| Example 5 | 0.01 | 0.50 | 0.53 | 1.03 | 0.928 |
| Example 6 | 0.10 | 0.50 | 0.53 | 1.03 | 0.917 |
| Example 7 | 0.10 | 0.50 | 0.65 | 1.15 | 0.821 |
| Example 8 | 0.03 | 0.53 | 0.50 | 1.03 | 0.964 |
| Example 9 | 0.03 | 0.53 | 0.53 | 1.06 | 0.950 |
| Comparative Example 1 | 0.03 | 0.50 | 0.50 | 1.00 | 0.538 |
| Comparative Example 2 | 0.03 | 0.50 | 0.505 | 1.005 | 0.576 |
| Comparative Example 3 | 0.03 | 0.50 | 0.80 | 1.30 | 0.787 |
| Comparative Example 4 | 0.03 | 0.50 | 0.90 | 1.40 | 0.690 |
| Comparative Example 5 | 0.00 | 0.50 | 0.53 | 1.03 | 0.645 |
| Comparative Example 6 | 0.003 | 0.50 | 0.53 | 1.03 | 0.667 |
| Comparative Example 7 | 0.20 | 0.50 | 0.53 | 1.03 | 0.635 |
| Comparative Example 8 | 0.10 | 0.50 | 0.70 | 1.20 | 0.621 |
| Comparative Example 9 | 0.15 | 0.50 | 0.80 | 1.30 | 0.669 |

5. 2. Evaluation of Piezoelectric Element

The piezoelectric members not subjected to patterning of the Examples and Comparative Examples were measured for their X-ray diffraction (XRD) patterns with D8 Discover (manufactured by Bruker AXS) at room temperature, using Cu—Kα radiation. The degree of orientation in the (100) direction was evaluated from the corresponding XRD pattern.

5. 3. Evaluation Results

The results of the degree of orientation are shown in the Table. The degree of orientation in the (100) direction shown in the Table is defined as the following equation (II):

$$\text{Degree of orientation} = \frac{(100)/(100)_{random}}{\{(100)/(100)_{random} + (110)/(110)_{random}\}} \quad (II)$$

In Equation (II), (100) represents the peak intensity of the (100) plane of the perovskite crystal structure in any one of the Examples and Comparative Examples, (110) represents the peak intensity of the (110) plane of the perovskite crystal structure in the same Example or Comparative Example, $(100)_{random}$ represents the peak intensity of the (100) plane of the perovskite crystal structure in typical KNN (randomly oriented), and $(110)_{random}$ represents the peak intensity of the (110) plane of the perovskite crystal structure in the KNN. For example, the degree of orientation of a sample made of a typical KNN is 0.5.

As shown in the Table, the piezoelectric members of the Examples were 0.8 or more, exhibiting satisfactory (100) orientation. On the other hand, it was found that the crystals of the piezoelectric members of the Comparative Examples had rather random orientation.

These results show that a piezoelectric member made of a specific complex oxide is likely to be preferentially oriented in the (100) direction, and the specific complex oxide contains potassium sodium niobate and bismuth ferrate in such proportions that the molar ratio of bismuth ferrate to the sum of potassium sodium niobate and bismuth ferrate is in the range of 3% to 10% and that the molar ratio of sum of potassium and sodium to niobium is in the range of 103% to 115%.

The embodiments described above can be appropriately combined with other embodiments. Combined embodiments can produce the effect of each embodiment and a synergistic effect.

The invention is not limited to the above-described embodiments, and various modifications may be made. For example, the invention includes substantially the same form as the disclosed embodiments (for example, a form including the same function and method and producing the same result, or a form having the same purpose and producing the same effect). Some elements unessential to the form of the disclosed embodiment may be replaced. The form of an embodiment of the invention includes an element producing the same effect or achieving the same object, as the form of the disclosed embodiments. The forms of the disclosed embodiments may be combined with the known art.

What is claimed is:

1. A piezoelectric element comprising:
    a piezoelectric member made of a complex oxide; and
    an electrode which contains platinum, wherein
    the complex oxide contains potassium sodium niobate and bismuth ferrate;
    a molar ratio of the bismuth ferrate to a sum of the potassium sodium niobate and the bismuth ferrate is in a range of 1% to 10%; and
    a molar ratio of a sum of potassium and sodium to niobium is in a range of 101% to 120%; and
    a molar ratio of a sum of the bismuth ferrate and potassium and sodium to niobium in potassium sodium niobate is in a range of 104% to 125%,
    wherein the piezoelectric member is preferentially oriented in the (100) direction.

2. A liquid ejecting head comprising the piezoelectric element as set forth in claim 1.

3. A liquid ejecting apparatus comprising the liquid ejecting head as set forth in claim 2.

4. The piezoelectric element of claim 1, wherein the preferential orientation in the (100) direction is characterized by a degree of orientation in a range of 91.7% to 97.3%.

* * * * *